United States Patent
Hampton et al.

(10) Patent No.: US 11,675,401 B2
(45) Date of Patent: Jun. 13, 2023

(54) THERMAL VENTING IN A PORTABLE INFORMATION HANDLING SYSTEM

(71) Applicant: Dell Products L.P., Round Rock, TX (US)

(72) Inventors: Patrick A. Hampton, Round Rock, TX (US); Qinghong He, Austin, TX (US); Ernesto Ramirez, Austin, TX (US)

(73) Assignee: Dell Products L.P., Round Rock, TX (US)

( * ) Notice: Subject to any disclaimer, the term of this patent is extended or adjusted under 35 U.S.C. 154(b) by 0 days.

(21) Appl. No.: 17/335,315

(22) Filed: Jun. 1, 2021

(65) Prior Publication Data

US 2022/0382346 A1 Dec. 1, 2022

(51) Int. Cl.
*G06F 1/20* (2006.01)
*H05K 7/20* (2006.01)
*G06F 1/16* (2006.01)

(52) U.S. Cl.
CPC .............. *G06F 1/206* (2013.01); *G06F 1/203* (2013.01); *H05K 7/2039* (2013.01); *H05K 7/20145* (2013.01); *G06F 1/1616* (2013.01)

(58) Field of Classification Search
CPC ...... G06F 1/203; G06F 1/1656; G06F 1/1662; G06F 1/20; G06F 2200/201; G06F 1/1666; G06F 1/182; G06F 1/206; G06F 1/1616; H05K 7/20172; H05K 7/20336; H05K 7/20145; H05K 7/20136; H05K 5/0213; H05K 7/20154; H05K 7/2039; F04D 29/4226
See application file for complete search history.

(56) References Cited

U.S. PATENT DOCUMENTS

| | | | | |
|---|---|---|---|---|
| 6,049,455 A * | 4/2000 | Nakamura | .......... | F04D 29/4226 361/689 |
| 8,379,383 B2 * | 2/2013 | Sugiura | .................. | G06F 1/203 361/679.48 |
| 8,553,409 B2 * | 10/2013 | Rehmann | ................ | G06F 1/206 361/679.49 |
| 9,232,171 B2 * | 1/2016 | Sugiura | ............. | H05K 7/20136 |
| 9,304,558 B2 * | 4/2016 | Horii | .................... | G06F 1/1616 |
| 10,423,200 B1 * | 9/2019 | North | .................... | G06F 1/1616 |
| 10,741,157 B2 * | 8/2020 | Jung | ...................... | G10K 11/16 |
| 11,320,876 B1 * | 5/2022 | North | ...................... | G06F 1/325 |
| 2002/0018337 A1 * | 2/2002 | Nakamura | ............ | G06F 1/1616 361/697 |
| 2002/0186532 A1 * | 12/2002 | Tomioka | ............ | H05K 7/20154 361/679.48 |
| 2008/0019093 A1 * | 1/2008 | Hongo | ................... | G06F 1/203 361/693 |

(Continued)

*Primary Examiner* — Michael A Matey
(74) *Attorney, Agent, or Firm* — Terrile, Cannatti & Chambers; Stephen A. Terrile

(57) ABSTRACT

A main housing portion of a portable information handing system. The main housing portion includes: a top cover portion; a bottom cover portion; and, an internal air intake ducting system, the internal air intake ducting system comprising a fan and a thermal channeling component thermally coupled to the fan, the thermal channeling component extending from an interior of a side of the bottom cover portion to the fan, the thermal channeling component and the bottom cover portion defining an air channel between the side of the bottom cover portion and the fan.

12 Claims, 9 Drawing Sheets

(56) References Cited

U.S. PATENT DOCUMENTS

| | | | |
|---|---|---|---|
| 2008/0030955 A1* | 2/2008 | Chen | H01L 23/427 257/E23.088 |
| 2008/0112130 A1* | 5/2008 | Nakamura | H01L 23/467 361/679.54 |
| 2009/0103265 A1* | 4/2009 | Hongo | G06F 1/203 361/690 |
| 2011/0222237 A1* | 9/2011 | Fujiwara | G06F 1/203 361/679.48 |
| 2013/0022382 A1* | 1/2013 | Raff | G06F 3/0202 219/137 R |
| 2013/0286292 A1* | 10/2013 | Yamaguchi | G06F 1/1656 361/692 |
| 2013/0329934 A1* | 12/2013 | Casebolt | G06F 1/1688 381/386 |
| 2016/0085273 A1* | 3/2016 | Delano | G06F 1/203 361/679.48 |
| 2017/0273214 A1* | 9/2017 | Casparian | G06F 1/1632 |
| 2019/0050031 A1* | 2/2019 | Utz | H05K 7/20327 |
| 2022/0129052 A1* | 4/2022 | Schwager | G06F 1/1662 |

\* cited by examiner

| SOUTHPEAK 15 | EXISTING DESIGN | DOUBLE HULL BOTTOM COVER | IMPROVEMENT |
|---|---|---|---|
| TABLE HEIGHT | 16.5 (3mm FEET) | 15.0 (0.5mm FEET) | -1.5mm |
| BASE THICKNESS | 13.5 | 14.5 | +1.0mm |
| C COVER TEMPERATURE | 47.7 | 48.0 | +0.3C |
| BOTTOM D COVER TEMPERATURE | 53.7 | 45.6 | -8.1C |
| HEATPIPE TEMPERATURE | 71.3 | 71.7 | +0.4C |

FIG. 12

THERMAL VENTING IN A PORTABLE INFORMATION HANDLING SYSTEM

BACKGROUND OF THE INVENTION

Field of the Invention

The present invention relates to information handling systems. More specifically, embodiments of the invention relate to thermal venting in a portable information handling system.

Description of the Related Art

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

SUMMARY OF THE INVENTION

In one embodiment the invention relates to a main housing portion of a portable information handing system, comprising: a top cover portion; a bottom cover portion; and, an internal air intake ducting system, the internal air intake ducting system comprising a fan and a thermal channeling component thermally coupled to the fan, the thermal channeling component extending from an interior of a side of the bottom cover portion to the fan, the thermal channeling component and the bottom cover portion defining an air channel between the side of the bottom cover portion and the fan.

In another embodiment the invention relates to an information handling system comprising: a processor; a data bus coupled to the processor; and an information handling system chassis housing, the housing comprising a base chassis, the base chassis housing the processor, the base chassis comprising a top cover portion; a bottom cover portion; and, an internal air intake ducting system, the internal air intake ducting system comprising a fan and a thermal channeling component thermally coupled to the fan, the thermal channeling component extending from an interior of a side of the bottom cover portion to the fan, the thermal channeling component and the bottom cover portion defining an air channel between the side of the bottom cover portion and the fan.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 12 shows a table summarizing simulation results of a portable information handling system incorporating internal air intake ducting.

DETAILED DESCRIPTION

Figure 1:
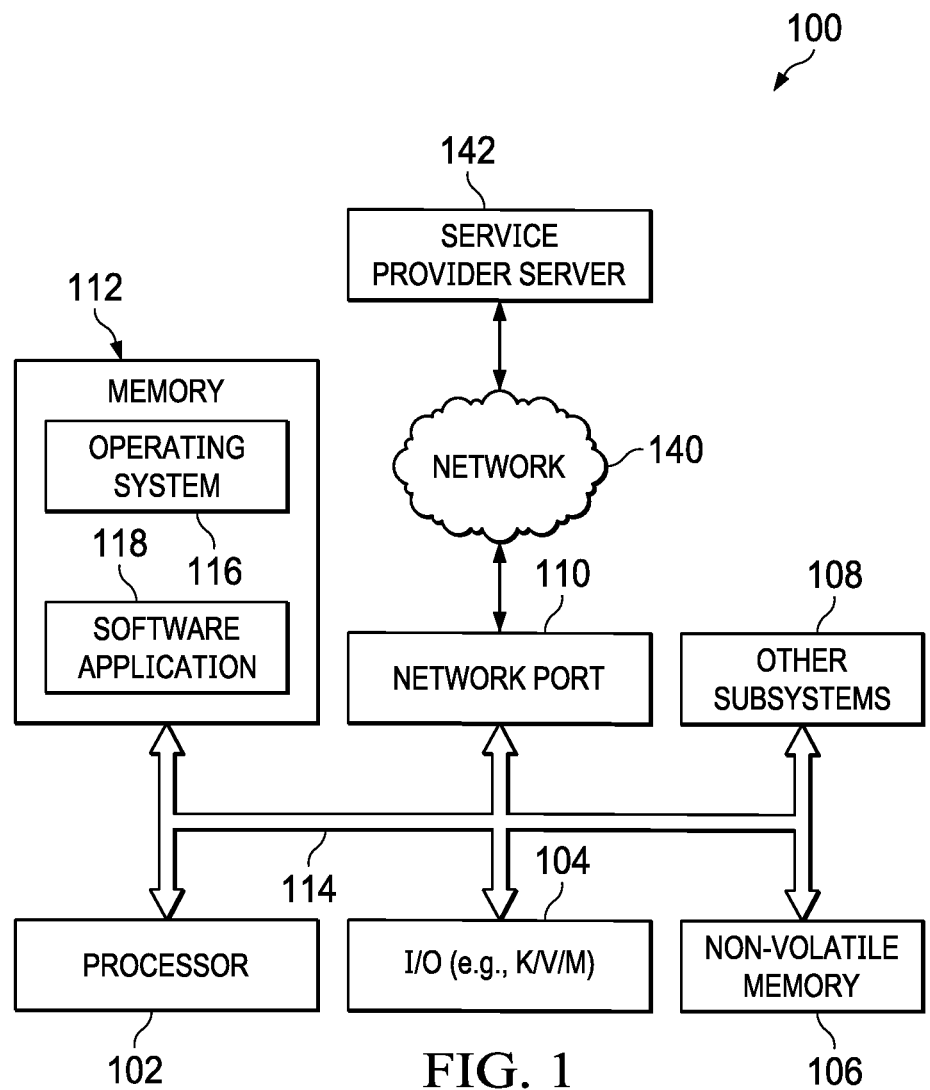
FIG. 1 shows a general illustration of components of an information handling system as implemented in the system and method of the present invention.

Various aspects of the present disclosure include an appreciation that portable information handling systems with higher performance requirements often require air intakes, tall bottom feet, internal spreaders, and in some cases, additional features on the product exterior to prevent recirculation of hot air leaving the system. Known bottom air intakes often require multiple slots to allow enough air into the system. These slots can weaken the bottom chassis structure and can also often require larger internal gaps to pass reliability requirements. Additionally, bottom air intakes can be susceptible to blocking when the system is placed on a soft surface such as a pillow, bed or sheet which will drop the system performance.

Various aspects of the present disclosure include an appreciation that portable information handling systems with higher performance requirements often require taller thermal feet to allow enough air intake. Taller thermal feet can result in an overall table to palmrest height which is undesirable. Depending on the fan design, additional ribs or side walls may need to be added to the bottom of the portable information handling system proximate to the bottom air intakes to prevent hot air from recirculating into the system via the bottom air intakes. Various aspects of the present disclosure include an appreciation that taller thermal feet and additional ribs can add cost to the system and may also detract from the appearance of the portable information handling system from an industrial design (ID) standpoint. Various aspects of the present disclosure include an appreciation that to achieve desired skin temperature requirements, portable information handling systems may also employ internal spreaders. The use of these internal spreaders can drive costs up depending on the material used and also drive internal gaps within the system.

Accordingly, a thermal venting solution is disclosed which allows for side thermal intake and does not rely on bottom venting, thermal feet, or air blocking ribs. Under certain conditions, the thermal venting solution can also remove a need for additional internal heat-spreaders. Additionally, the thermal venting solution enables a lower table to palmrest height while dropping the bottom skin temperatures relative to bottom vented systems at the same level of central processing unit/graphics processing unit (CPU/GPU) performance. In certain embodiments, the thermal venting solution attaches an internal enclosure (e.g., a channel cover) to the inside surface of the bottom chassis. The internal enclosure functions as a duct and can include formed channels designed specifically for a particular portable information handling system. The duct cover also functions as a heat spreader over hot components of the portable information handling system. Heat is drawn away from the components via the thermally conductive duct cover, thereby lowering the internal hot spot. In certain embodiments, the duct cover may induce a slight trade-off in CPU/GPU junction temperature (Tj).

In certain embodiments, the thermal venting solution includes a two-piece, side ducting enclosure affixed to the internal surface of a portable information handling system. In certain embodiments, the thermal venting solution provides an intake air management function and a heat spreading function. In certain embodiments, channel ducting patterns of the channel cover may be optimized for the thermal needs for a particular portable information handling system. For example, if certain areas of the system are hotter than others, more air can be redirected to the hot spot by varying the channel thickness between the bottom cover and the ducting cover. In certain embodiments, the thermal venting solution includes a nested fan. In certain embodiments, the nested fan is coupled to the ducting enclosure via a gasket. In certain embodiments, the gasket is a thermal gasket. Such a thermal venting solution allows for thinner system Z stackup. Such a thermal venting solution allows for improved overall skin temperatures/performance even when the device is placed on a soft surface such as a bed sheet, pillow, or comforter.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

FIG. 1 is a generalized illustration of an information handling system 100 that can be used to implement the system and method of the present invention. The information handling system 100 includes a processor (e.g., central processor unit or "CPU") 102, input/output (I/O) devices 104, such as a display, a keyboard, a mouse, a touchpad or touchscreen, and associated controllers, a hard drive or disk storage 106, and various other subsystems 108. In various embodiments, the information handling system 100 also includes network port 110 operable to connect to a network 140, which is likewise accessible by a service provider server 142. The information handling system 100 likewise includes system memory 112, which is interconnected to the foregoing via one or more buses 114. System memory 112 further comprises operating system (OS) 116 and in various embodiments may also comprise at least one software application 118. In one embodiment, the information handling system 100 is able to download the software application from the service provider server 142. In another embodiment, the software application 118 is provided as a service from the service provider server 142.

Figure 2:
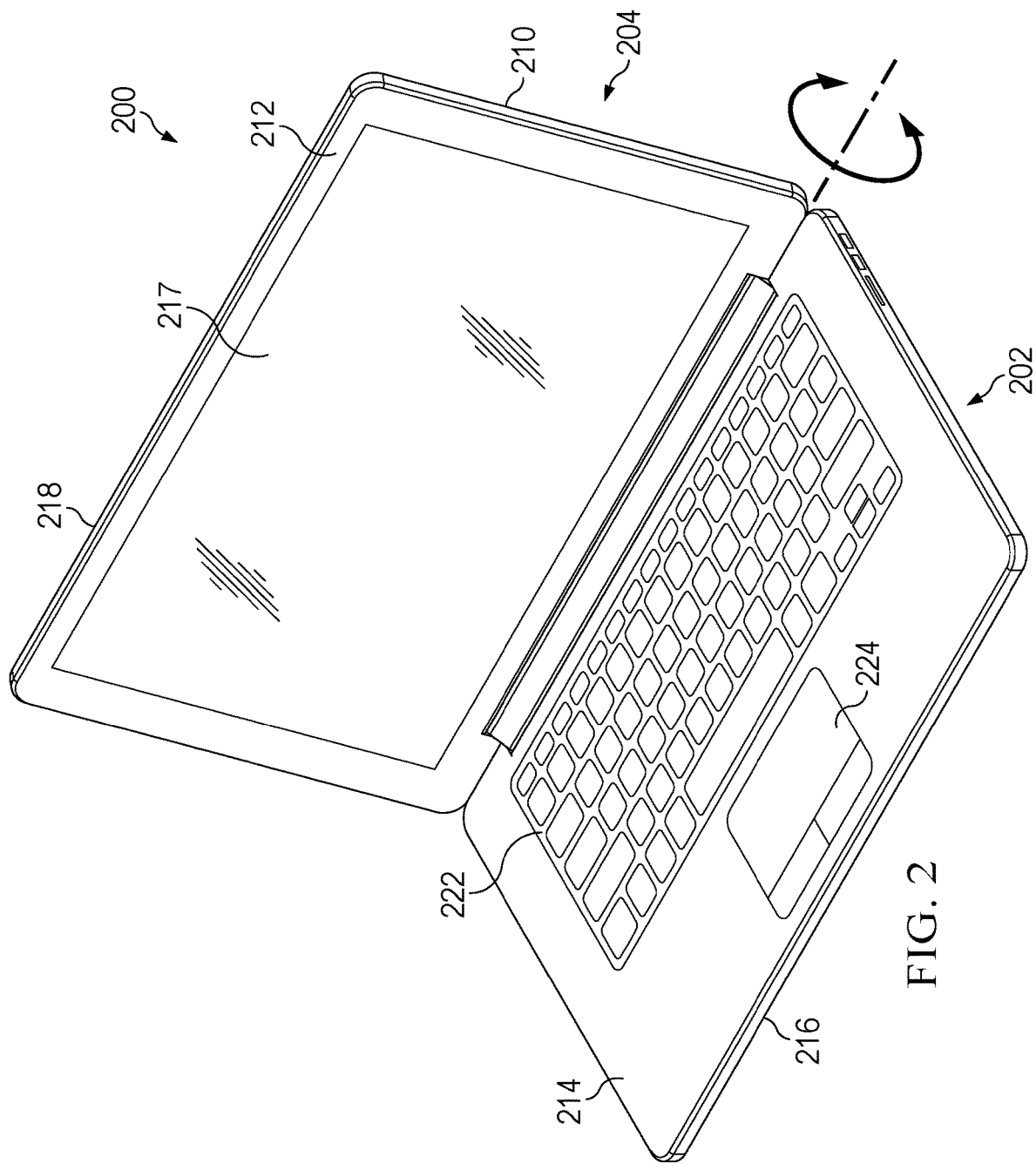
FIG. 2 shows a perspective view of an example portable information handling system.

FIG. 2 shows a perspective view of an example portable information handling system chassis 200 such as a tablet type portable information handling system, a laptop type portable information handling system, or any other mobile information handling system. It will be appreciated that some or all of the components of the information handling system 100 may be included within information handling system chassis 200. The portable information handling system 200 chassis includes a base chassis 202 and a display chassis 204 shown in an open configuration. It will be appreciated that a closed configuration would have the display chassis 204 fully closed onto the base chassis 202.

The base chassis 202 or the display chassis 204 of the information handling system 200 may comprise an outer metal case or shell. The information handling system 200 may include a plurality of chassis portions. In various embodiments, the information handling system 200 may include some or all of an A-Cover 210, a B-Cover 212, a C-cover 214 and a D-Cover 216. In various embodiments, the A-Cover 210 and the B-Cover 212 provide the display chassis 204. In various embodiments, the C-Cover 214 and the D-Cover 216 provide the base chassis 202.

In various embodiments, the A-cover 210 encloses a portion of the display chassis 204 of the information handling system 200. In various embodiments, the B-cover 212 encloses another portion of the display chassis 204 of the information handling system 200. In various embodiments, the B-Cover may include a display screen 217 and a bezel 218 around the display screen.

In various embodiments, the C-cover 214 encloses a portion of the base chassis 202 of the information handling system 200. In various embodiments, the C-cover 214 may include, for example, a keyboard 222, a trackpad 224, or other input/output (I/O) device. In various embodiments, certain components of the information handling system such as a mother board are mounted within the C-Cover 214. In various embodiments, the D-cover 216 encloses another portion of the base chassis 202 of the information handling system 200.

When placed in the closed configuration, the A-cover 202 forms a top outer protective shell, or a portion of a lid, for the information handling system 200, while the D-cover 204 forms a bottom outer protective shell, or a portion of a base, for the information handling system. When in the fully closed configuration, the A-cover 202 and the D-cover 204 would be substantially parallel to one another.

In some embodiments, both the A-cover 202 and the D-cover 204 may be comprised entirely of metal. In some embodiments, the A-cover 202 and D-cover 204 may include both metallic and plastic components. For example, plastic components that are radio-frequency (RF) transparent may be used to form a portion of the C-cover 208.

In various embodiments, the A-cover 202 may be movably connected to a back edge of the D-cover 204 via one or more hinges. In this configuration, the hinges allow the A-cover 202 to rotate from and to the D-cover 204 allowing for multiple orientations of the information handling system 200. In various embodiments, the information handling system may include a sensor to detect the orientation of the information handling system and activate or deactivate any number of antenna systems based on the occurrence of any specific orientation. In some embodiments, the information handling system may be a laptop with limited rotation of the A-cover 204 with regard to the D-cover 204, for example up to 180° rotation arc. In other embodiments the information handling system 200 may be a convertible information handling system with full rotation to a tablet configuration.

Figure 3:
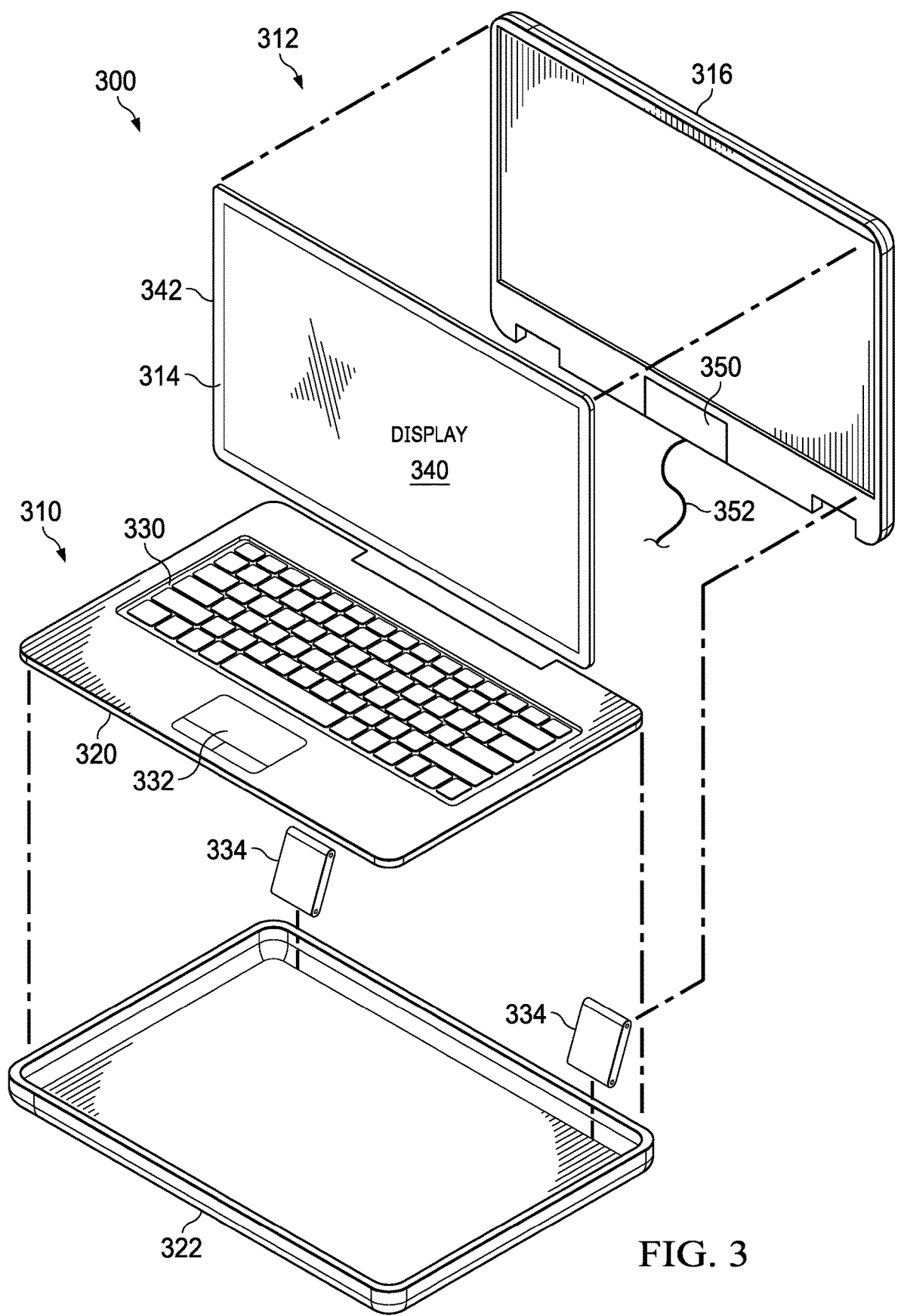
FIG. 3 shows a blown-up view of a portable information handling system.

FIG. 3 shows a blown-up view of a portable information handling system 300 having rotationally-coupled housing portions. In the example embodiment, a main housing portion 310 (which corresponds to a base chassis 202) rotationally couples to a lid housing portion 312 (which corresponds to a display chassis 204) to support various configurations to interact with an end user. Main housing portion 310 may hold one or more components of the portable information handling system, including but not limited to processor 102, system bus 114, memory subsystem 112, I/O subsystem 104 and network interface 110 discussed with respect to FIG. 1. Main housing portion 310 includes a top cover portion 320 (which includes the C-Cover 214) and a bottom cover portion 322 (which includes the D-Cover 216). Lid housing portion 312 includes a display cover portion 314 (which includes the B-Cover 210) and a rear display cover portion 316 (which includes the A-Cover 212). The top cover portion 320 may include an integrated keyboard 330 or other I/O devices, such as a trackpad 332 or microphone (not shown). In various embodiments, the keyboard 330 may be mounted to the top of the C-Cover of the main housing portion 310. In various embodiments, the keyboard 330 may be mounted to the underside of the C-Cover of the main housing portion 310.

Lid housing portion 312 is rotationally coupled to main housing portion 310 via at least one hinge assembly 334. Lid housing portion 212 includes display 340 that visually presents information to the user as well as a bezel 342. Display 340 may be a touch panel with circuitry enabling touch functionality in conjunction with a display. In some embodiments, display 340 may be an "infinity edge" or "narrow bezel" display that approaches one or more the edges of lid housing portion 212 such that bezel may be narrow in size (e. g., less than 10 millimeters) on the edges. For example, display 340 is an infinity display with narrow bezels on the top and sides of lid housing portion 212 in the embodiment shown in FIG. 3. In certain embodiments, the side bezel is less than 4 mm (+/−10%) and the top bezel is less than 6 mm (+/−10%).

Lid housing portion 212 may also include timing controller (TCON) 350. Hinge assembly 330 may include cable 352 for communicably coupling one or more components within main housing portion 310 to one or more components within lid housing portion 312. For example, cable 352 may provide communication of graphics information from an I/O subsystem to TCON 350 for generation of visual images for display on display 340. Although a single cable 352 is shown, portable information handling system 300 may include one or more additional cables 352 for communicating components disposed in main housing portion 310 and lid housing portion 312. Placement of cable 352 may be selected based on design considerations, materials or manufacturing cost, material reliability, antenna placement, as well as any other considerations.

Hinge assembly 334 allows main housing portion 310 and lid housing portion 312 to rotate between a plurality of positions. For example, when portable information handling system 300 is not in use, lid housing portion 312 may be closed over the top of main portion 310 such that display 340 and keyboard 330 are protected from unintended use or damage. Rotation of lid housing portion 312 by approximately 90 degrees from main housing portion 310 brings display 340 in a raised "clamshell" position relative to keyboard 330 so that an end user can make inputs to keyboard 330 or touch panel portion of display 340 while viewing display 340. In some embodiments, clamshell position may represent lid housing portion 212 open between approximately 1 and 180 degrees from main housing portion 310. Rotation of lid housing portion 312 between approximately 180 and 359 degrees from main housing portion 310 may place portable information handling system 300 in "tablet stand" and/or "tent" positions. In tablet stand and tent positions, the user may make inputs via touch panel portion of display 340 while viewing display 340. A full 360 degree rotation of main housing portion 310 relative to lid housing portion 312 provides a tablet configuration having display 340 exposed to accept touch inputs. In any position, user inputs may be communicated to an I/O subsystem or a processor of the portable information handling system 300 for processing, and then updated information may be communicated back via cable 352 to display 340 for displaying to the user. Hinge assembly 334 may be comprised of one or more discrete hinges or a unified assembly of hinges.

Figure 4:
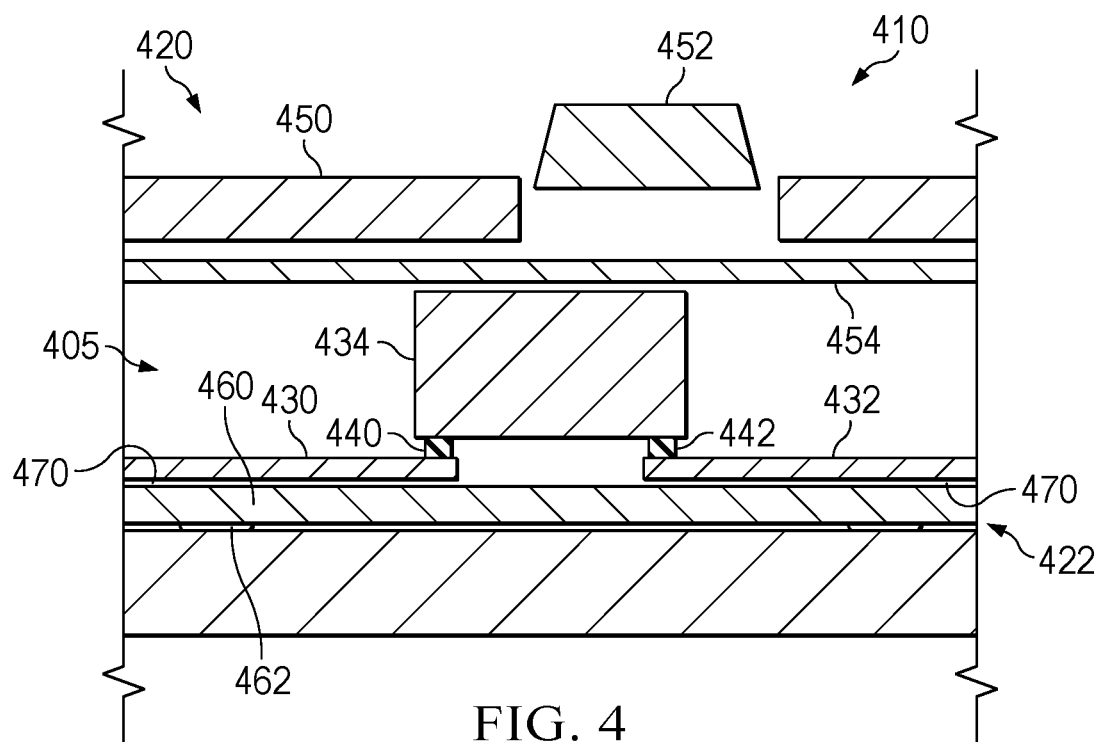
FIG. 4 shows a block diagram view cross sectional of a portable information handling system incorporating internal air intake ducting according to an embodiment of the disclosure.

FIG. 4 shows a block diagram cross sectional view of a portable information handling system 400 incorporating internal air intake ducting system 405 to an embodiment of the disclosure. More specifically, the internal air intake ducting system 405 is included within a main housing portion 410 of a portable information handling system. The main housing portion 410 includes a top cover portion 420 and a bottom cover portion 422. In various embodiments, the main housing portion 410 corresponds to main housing portion 310, top cover portion 420 corresponds to top cover portion 320 and bottom cover portion 422 corresponds to bottom cover portion 322.

The internal air intake ducting system 405 includes thermal channeling component 430, thermal channeling component 432, fan 434. In certain embodiments, the thermal channeling components 430, 432 are thermally coupled to the fan 434 via gaskets 440, 442. In certain embodiments, the gaskets comprise thermal gaskets. In certain embodiments, the thermal channeling components 430, 432 are constructed of thermally conductive material. In certain embodiments, the thermal channeling components 430, 432 are constructed of metal.

In certain embodiments, the top cover portion 420 includes a top cover 450, a keyboard 452 and a keyboard support plate 454. In certain embodiments, the bottom cover portion 422 includes a bottom cover 460. In certain embodiments, the bottom cover 460 includes low profile feet. In certain embodiments, the bottom cover 460 does not have any feet. In certain embodiments, the thermal channeling components 430, 432 are spaced from the bottom cover in the Z direction to provide an air flow channel from a side air vent 470 to the fan 434. In certain embodiments, the side air vents 570 provide an air intake function.

The internal air intake ducting system 405 allows for side thermal intake and does not rely on bottom venting, thermal feet, or air blocking ribs. In certain embodiments, the internal air intake ducting system 405 removes a need for additional internal heat-spreaders as the thermal channeling component 430 and thermal channeling component 432 function as heat spreaders. Additionally, the internal air intake ducting system 405 enables a lower table to palmrest height while dropping the bottom skin temperatures relative to bottom vented systems at the same level of central processing unit/graphics processing unit (CPU/GPU) performance. In certain embodiments, the internal air intake ducting system 405 attaches to the inside surface 462 of the bottom cover 460. The internal enclosure functions as a duct and can include formed channels designed specifically for a particular portable information handling system. Heat is drawn away from components contained within the bottom cover portion via the thermally conductive thermal channeling components 430, 432. In certain embodiments, the duct cover may induce a slight trade-off in CPU/GPU Tj.

In certain embodiments, the internal air intake ducting system 405 provides a two-piece, side ducting enclosure affixed to the internal surface of the bottom cover 460. In certain embodiments, the internal air intake ducting system 405 provides an intake air management function and a heat spreading function. Such a internal air intake ducting system 405 allows for thinner system Z stackup. Such an internal air intake ducting system 405 allows for improved overall skin temperatures/performance even when the device is placed on a soft surface such as a bed sheet, pillow, or comforter.

Figure 5:
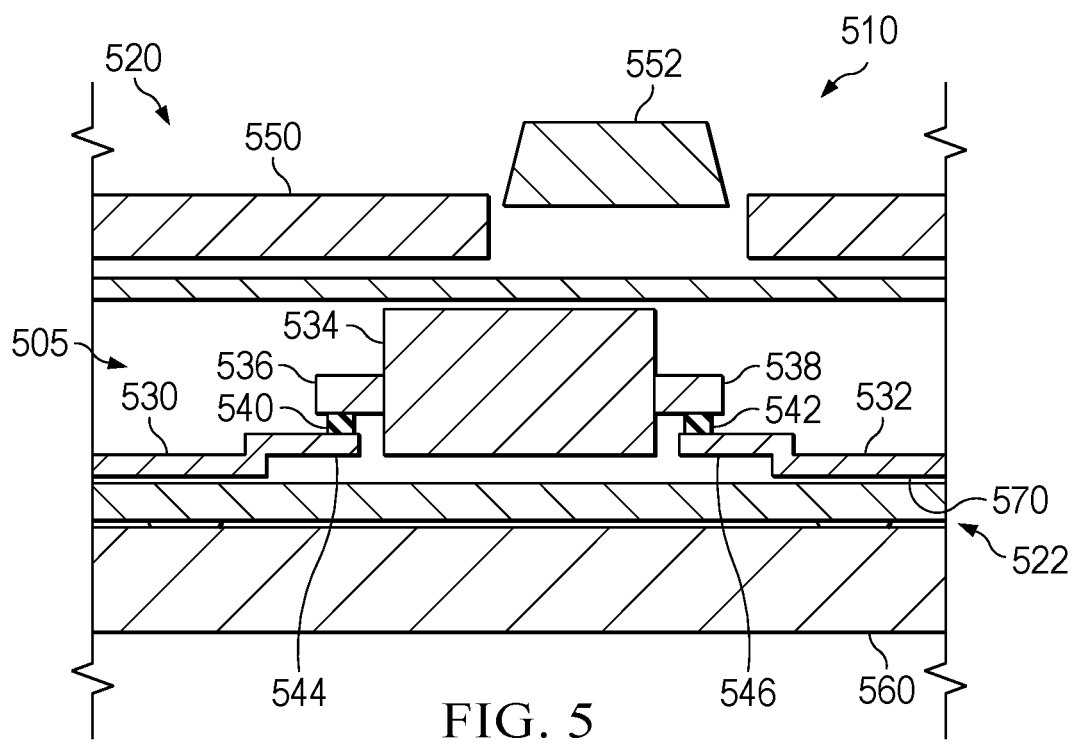
FIG. 5 shows a block diagram cross sectional view of a portable information handling system incorporating internal air intake ducting according to another embodiment of the disclosure.

FIG. 5 shows a block diagram cross sectional view of a portable information handling system 500 incorporating internal air intake ducting system 505 to an embodiment of the disclosure. More specifically, the internal air intake ducting system 505 is included within a main housing portion 510 of a portable information handling system. The main housing portion 510 includes a top cover portion 520 and a bottom cover portion 522. In various embodiments, the main housing portion 510 corresponds to main housing portion 310, top cover portion 520 corresponds to top cover portion 320 and bottom cover portion 522 corresponds to bottom cover portion 322.

The internal air intake ducting system 505 includes thermal channeling component 530, thermal channeling component 532, and fan 534. In certain embodiments, the fan 534 includes fan sealing flange 536 and fan sealing flange 538. In certain embodiments, the thermal channeling components 530, 532 are thermally coupled to the fan 534 via gaskets 540, 542. In certain embodiments, the gaskets comprise thermal gaskets. In certain embodiments, the thermal channeling components 530, 532 include respective step portions 544, 546. In certain embodiments, the step portion 544, 546 are thermally coupled to the fan 534 via respective fan sealing flanges 536, 538. In certain embodiments, the thermal channeling components 530, 532 are constructed of thermally conductive material. In certain embodiments, the thermal channeling components 530, 532 are constructed of metal.

In certain embodiments, the top cover portion 520 includes a top cover 550, a keyboard 552 and a keyboard support plate 554. In certain embodiments, the bottom cover portion 522 includes a bottom cover 560. In certain embodiments, the bottom cover 560 includes low profile feet. In certain embodiments, the bottom cover 560 does not have any feet. In certain embodiments, the thermal channeling components 530, 532 are spaced from the bottom cover in the Z direction to provide an air flow channel from a side air vent 570 to the fan 534. In certain embodiments, the side air vents 570 provide an air intake function. In certain embodiments, the step portions 544, 546 provide an increased air vent z dimension to provide additional air flow from the side intakes 570.

The internal air intake ducting system 505 allows for side thermal intake and does not rely on bottom venting, thermal feet, or air blocking ribs. In certain embodiments, the internal air intake ducting system 505 removes a need for additional internal heat-spreaders as the thermal channeling component 530 and thermal channeling component 532 function as heat spreaders. Additionally, the internal air intake ducting system 505 enables a lower table to palmrest height while dropping the bottom skin temperatures relative to bottom vented systems at the same level of central processing unit/graphics processing unit (CPU/GPU) performance. In certain embodiments, the internal air intake ducting system 505 attaches to the inside surface of the bottom cover 560. The internal enclosure functions as a duct and can include formed channels designed specifically for a particular portable information handling system. Heat is drawn away from components contained within the bottom cover portion via the thermally conductive thermal channeling components 530, 532. In certain embodiments, the duct cover may induce a slight trade-off in CPU/GPU Tj.

In certain embodiments, the internal air intake ducting system 505 provides a two-piece, side ducting enclosure affixed to the internal surface of the bottom cover 560. In certain embodiments, the internal air intake ducting system 505 provides an intake air management function and a heat spreading function. Such a internal air intake ducting system 505 allows for thinner system Z stackup. Such an internal air intake ducting system 505 allows for improved overall skin temperatures/performance even when the device is placed on a soft surface such as a bed sheet, pillow, or comforter.

Figure 6:
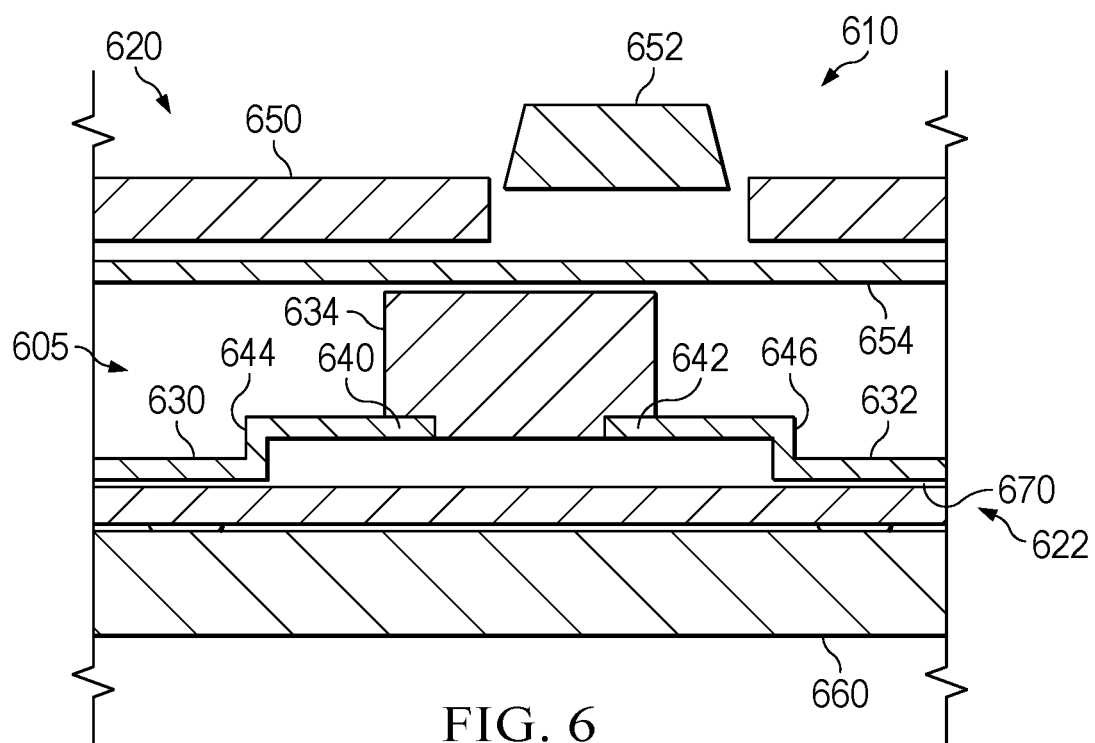
FIG. 6 shows a block diagram cross sectional view of a portable information handling system incorporating internal air intake ducting according to another embodiment of the disclosure.

FIG. 6 shows a block diagram cross sectional view of a portable information handling system 500 incorporating internal air intake ducting system 605 to an embodiment of the disclosure. More specifically, the internal air intake ducting system 605 is included within a main housing portion 610 of a portable information handling system. The main housing portion 610 includes a top cover portion 620 and a bottom cover portion 622. In various embodiments, the main housing portion 610 corresponds to main housing portion 310, top cover portion 620 corresponds to top cover portion 320 and bottom cover portion 622 corresponds to bottom cover portion 322.

The internal air intake ducting system 605 includes thermal channeling component 630, thermal channeling component 632, fan 634. In certain embodiments, the fan 634 includes fan thermal channeling component mounting portion 640 and fan thermal channeling component mounting portion 642. In certain embodiments, the thermal channeling components 630, 632 are thermally coupled to the fan 634 via respective fan thermal channeling component mounting portions 640, 642. In certain embodiments, the thermal channeling components 630, 632 include respective step portions 644, 646. In certain embodiments, the step portions 644, 646 are thermally coupled to the fan 634 via respective fan thermal channeling component mounting portions 640, 642. In certain embodiments, the fan thermal channeling component mounting portions 640, 642 have a depth which corresponds to the height of the thermal channeling component so that the bottom of the thermal channeling component is substantially flush with the bottom of the fan.

In certain embodiments, the thermal channeling components 630, 632 are constructed of thermally conductive material. In certain embodiments, the thermal channeling components 630, 632 are constructed of metal.

In certain embodiments, the top cover portion 620 includes a top cover 650, a keyboard 652 and a keyboard support plate 654. In certain embodiments, the bottom cover portion 622 includes a bottom cover 660. In certain embodiments, the bottom cover 660 includes low profile feet. In certain embodiments, the bottom cover 660 does not have any feet. In certain embodiments, the thermal channeling components 630, 632 are spaced from the bottom cover in the Z direction to provide an air flow channel from a side air vent 670 to the fan 634. In certain embodiments, the side air vents 570 provide an air intake function. In certain embodiments, the step portions 644, 646 provide an increased air vent z dimension to provide additional air flow from the side air vents 570.

The internal air intake ducting system 605 allows for side thermal intake and does not rely on bottom venting, thermal feet, or air blocking ribs. In certain embodiments, the internal air intake ducting system 605 removes a need for additional internal heat-spreaders as the thermal channeling component 630 and thermal channeling component 632 function as heat spreaders. Additionally, the internal air intake ducting system 605 enables a lower table to palmrest height while dropping the bottom skin temperatures relative to bottom vented systems at the same level of central processing unit/graphics processing unit (CPU/GPU) performance. In certain embodiments, the internal air intake ducting system 605 attaches to the inside surface of the bottom cover 660. The internal enclosure functions as a duct and can include formed channels designed specifically for a particular portable information handling system. Heat is drawn away from components contained within the bottom cover portion via the thermally conductive thermal channeling components 630, 632. In certain embodiments, the duct cover may induce a slight trade-off in CPU/GPU Tj.

In certain embodiments, the internal air intake ducting system 605 provides a two-piece, side ducting enclosure affixed to the internal surface of the bottom cover 660. In certain embodiments, the internal air intake ducting system 605 provides an intake air management function and a heat spreading function. Such an internal air intake ducting system 605 allows for thinner system Z stackup. Such an internal air intake ducting system 605 allows for improved overall skin temperatures/performance even when the device is placed on a soft surface such as a bed sheet, pillow, or comforter.

Figure 7:
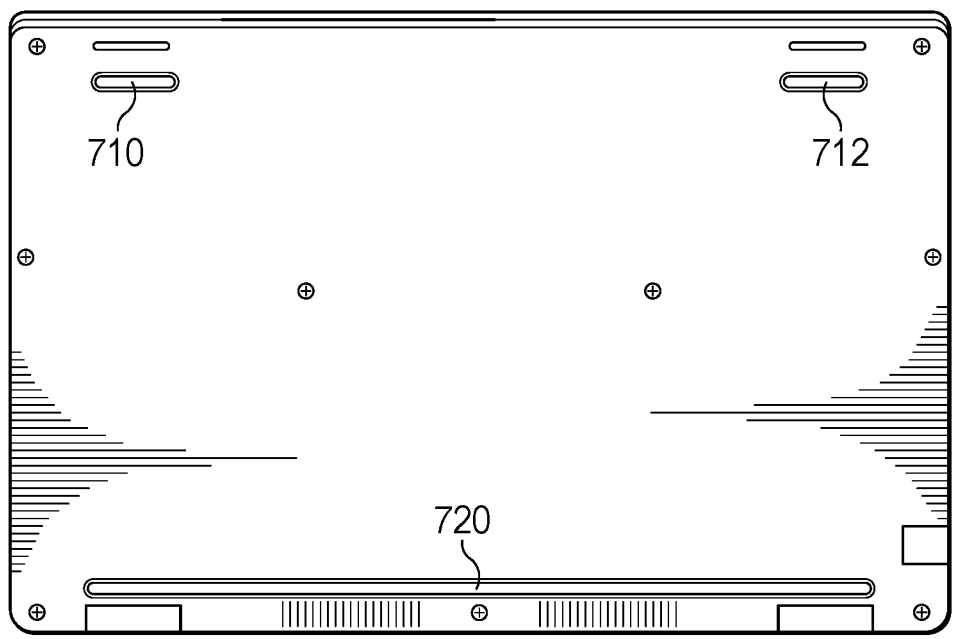
FIG. 7 shows a bottom view of a portable information handling system incorporating internal air intake ducting.

FIG. 7 shows a bottom view of a portable information handling system 700 incorporating internal air intake ducting. By incorporating an internal air intake ducting system such as incorporating internal air intake ducting system 405, incorporating internal air intake ducting system 505 or incorporating internal air intake ducting system 605, the information handling system may be configured with reduced front feet 710, 712 as well as a reduced continuous rear foot 720. In certain embodiments, by incorporating an internal air intake ducting system such as incorporating internal air intake ducting system 405, incorporating internal air intake ducting system 505 or incorporating internal air intake ducting system 605, the information handling system may be configured without feet.

Reduced or no feet enables a lower table to palmrest height while dropping the bottom skin temperatures relative to bottom vented systems at the same level of central processing unit/graphics processing unit (CPU/GPU) performance. In certain embodiments, by an internal air intake ducting system, a table height of the information handling system can be reduced 1.5 mm (+/−20%) when compared with systems which do not incorporate such an internal air intake ducting system.

Figure 8A:
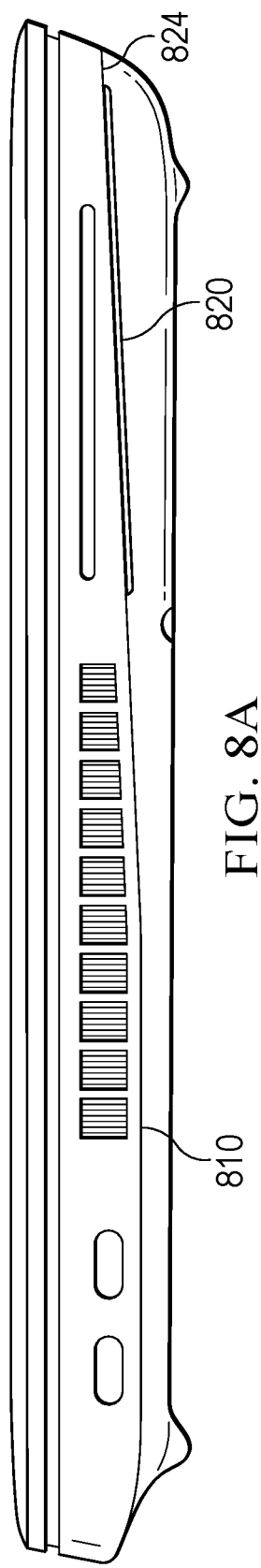
FIGS. 8A and 8B show side views of a portable information handling system incorporating internal air intake ducting.
Figure 8B:
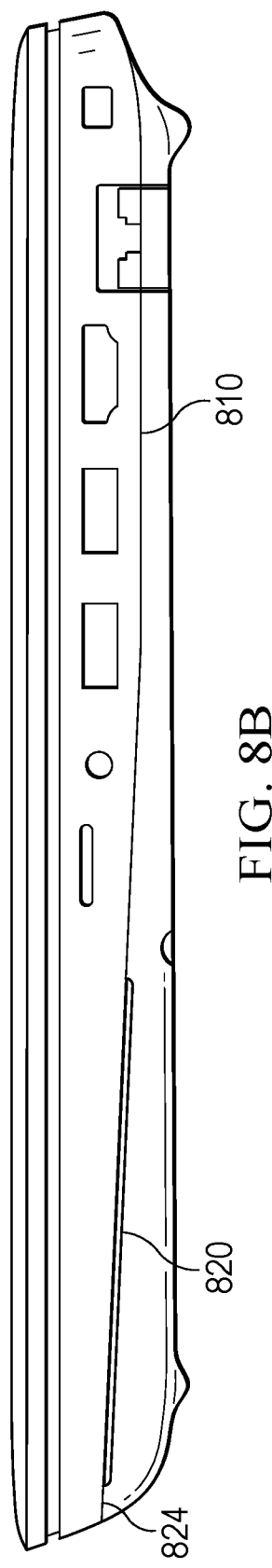
Figure 8C:
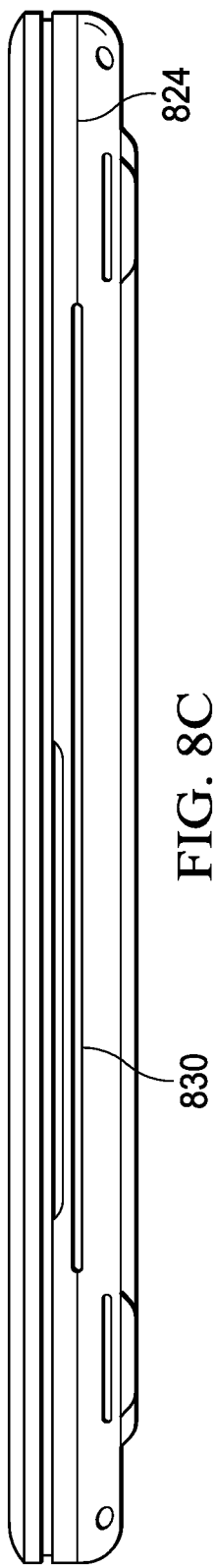
FIG. 8C shows a front view of a portable information handling system incorporating internal air intake ducting.

FIGS. 8A and 8B show side views of a portable information handling system 800 incorporating internal air intake ducting. FIG. 8C shows a front view of a portable information handling system incorporating internal air intake ducting.

In certain embodiments, the portable information handling system 800 includes an angled side wall demarcation portion 810. In certain embodiments, the angled side wall demarcation portion 810 extends downwardly from the front to the portable information handling system to the rear of the portable information handling system. In certain embodiments, the angled side wall demarcation portion 810 defines a boundary between a first side wall portion and a second side wall portion. In certain embodiments, the first side wall portion is substantially vertical. In certain embodiments, the second side wall portion extends inwardly from the first side wall portion. In certain embodiments, a side air intake 820 is integrated into and extends along the angled side wall demarcation portion 810 on each side of the portable information handling system 800.

In certain embodiments, the portable information handling system includes a straight front wall demarcation portion 824. In certain embodiments, the straight front wall demarcation portion 824 extends across the front to the portable information handling system from one side of the portable information handling system to the other side of the portable information handling system. In certain embodiments, the straight front wall demarcation portion 810 defines a boundary between a first front wall portion and a second front wall portion. In certain embodiments, the first front wall portion is substantially vertical. In certain embodiments, the second front wall portion extends inwardly from the first front wall portion. In certain embodiments, a front air intake 830 is integrated into and extends along the straight front wall demarcation portion 810 of the portable information handling system 800.

Figure 9:
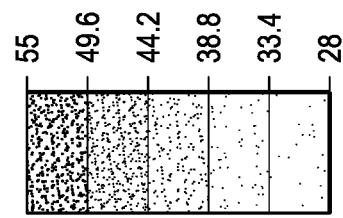
FIG. 9 shows an example heat distribution across a cross section of a portable information handling system incorporating internal air intake ducting.

FIG. 9 shows an example heat distribution across a cross section of a portable information handling system incorporating internal air intake ducting. More specifically, in the example heat distribution, internally generated heat of the portable information handling system is vented via the air intake vents such as one or more of the side wall air intakes and the front wall intake. In certain embodiments, the internally generated heat is vented from the air intakes via an air channel defined by the bottom cover and a thermal channeling component. In certain embodiments, the air channel has an air channel height of substantially 2.5 mm (e.g., +/−20%). In certain embodiments, the example heat distribution demonstrates the heat spreader function of the thermal channeling component.

Figure 10:
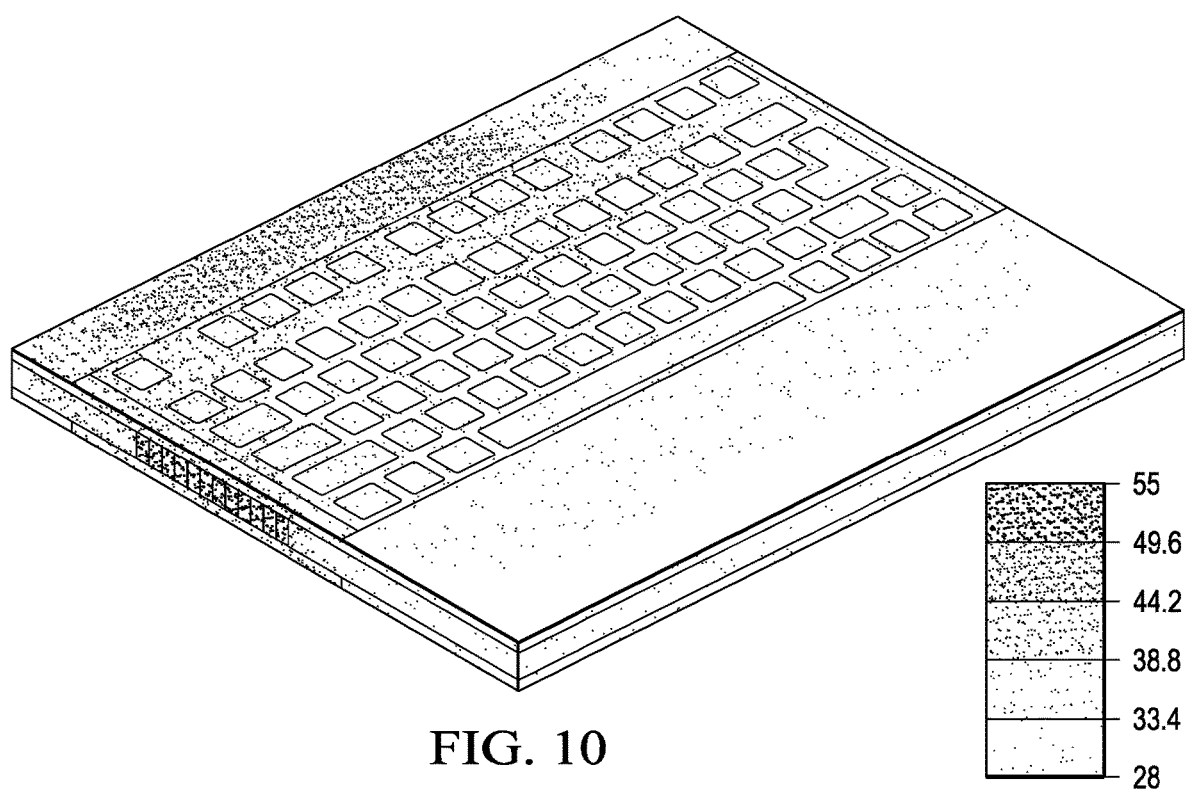
FIG. 10 shows an example heat distribution of a C-Cover of a portable information handling system incorporating internal air intake ducting.

FIG. 10 shows an example heat distribution of a C-Cover of a portable information handling system incorporating internal air intake ducting. More specifically, in the example heat distribution, internally generated heat of the portable information handling system is distributed to the read edge of the portable information handling system and a side air output of the portable information handling system.

Figure 11:
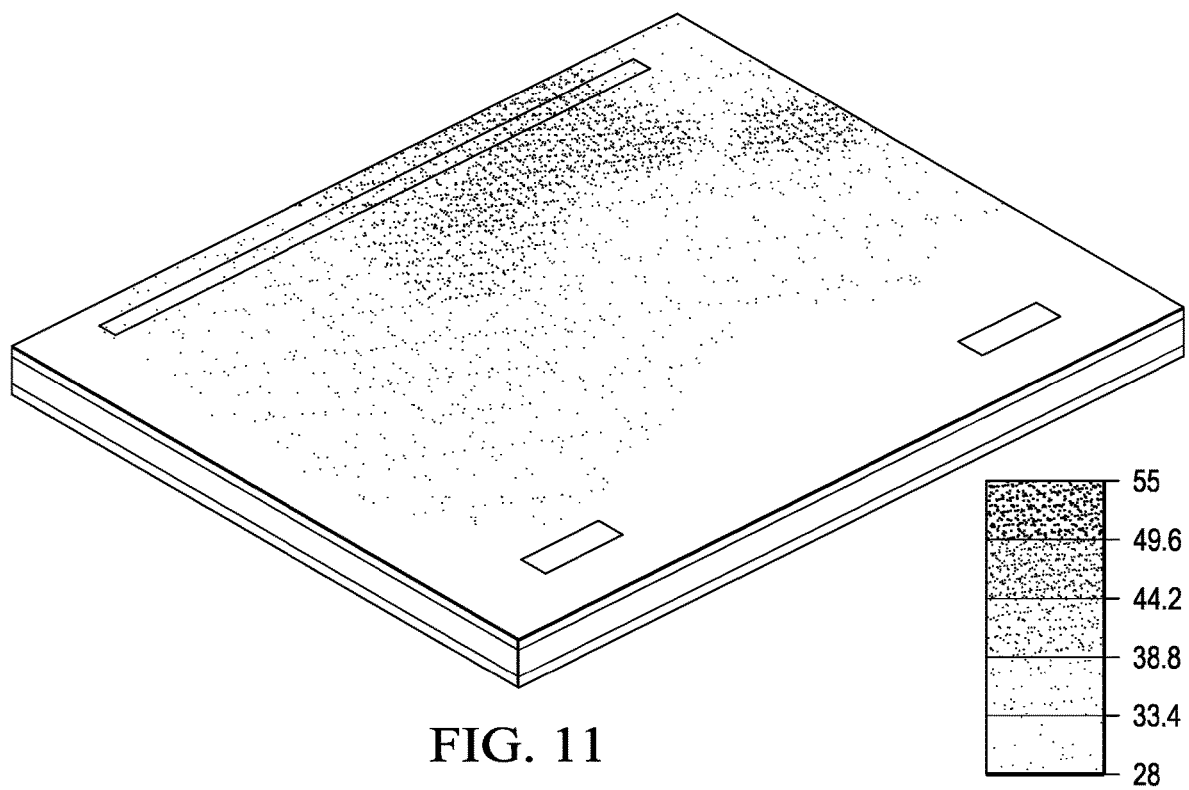
FIG. 11 shows an example heat distribution of a D-Cover of a portable information handling system incorporating internal air intake ducting.

FIG. 11 shows an example heat distribution of a D-Cover of a portable information handling system incorporating internal air intake ducting. More specifically, in the example heat distribution, internally generated heat of the portable information handling system is distributed to a bottom portion of the portable information handling system positioned below the main heat generating components, a read edge of the portable information handling system and a side air output of the portable information handling system.

FIG. 12 shows a table summarizing simulation results of a portable information handling system incorporating internal air intake ducting. More specifically, incorporating an internal air intake ducting system such as incorporating internal air intake ducting system 405, incorporating internal air intake ducting system 505 or incorporating internal air intake ducting system 605, the information handling system includes a table height improvement of substantially −1.5 mm (e.g., +/−20%), a base thickness improvement of substantially −1.0 mm (e.g., +/−20%), a C Cover temperature of +0.3 C. (e.g., +/−20%), a D Cover temperature improvement of −8.1 C. (e.g., +/−20%) and a heat pipe temperature of substantially 0.4 C. (e.g., +/−20%). In certain embodiments, the heat pipe temperature represents the temperature within the air channel defined by the bottom cover and a thermal channeling component.

The present invention is well adapted to attain the advantages mentioned as well as others inherent therein. While the present invention has been depicted, described, and is defined by reference to particular embodiments of the invention, such references do not imply a limitation on the invention, and no such limitation is to be inferred. The invention is capable of considerable modification, alteration, and equivalents in form and function, as will occur to those ordinarily skilled in the pertinent arts. The depicted and described embodiments are examples only and are not exhaustive of the scope of the invention.

Consequently, the invention is intended to be limited only by the spirit and scope of the appended claims, giving full cognizance to equivalents in all respects.

What is claimed is:

1. A main housing portion of a portable information handing system, comprising:
   a top cover portion;
   a bottom cover portion; and,
   an internal air intake ducting system, the internal air intake ducting system comprising a fan and a thermal channeling component thermally coupled to the fan, the thermal channeling component extending from an interior of a side of the bottom cover portion to the fan, the thermal channeling component and the bottom cover portion defining an air channel between the side of the bottom cover portion and the fan, the thermal channeling component being affixed to an internal surface of the side of the bottom cover portion; and wherein
   providing the air channel between the side of the bottom cover portion and the fan provides a thermal venting solution that does not rely on one or both of bottom venting and thermal feet.

2. The main housing portion of claim 1, wherein:
   the thermal channeling component is thermally coupled to the fan via a gasket.

3. The main housing portion of claim 1, wherein:
   the thermal channeling component is thermally coupled to the fan via a fan thermal channeling component mounting portion.

4. The main housing portion of claim 1, wherein:
   the thermal channeling component comprises a step portion, the step portion providing a taller air channel along a portion of the air channel between the side of the bottom cover and the fan.

5. The main housing portion of claim 4, wherein:
   the taller air channel is proximate with the fan.

6. The main housing portion of claim 1, wherein:
   the bottom cover comprises an angled side wall demarcation portion, the angled side wall demarcation portion extending downwardly from a front of the main housing portion to a rear of the main housing portion; and,
   an air intake is integrated into the angled side wall demarcation portion, the air intake extending downwardly from the front of the main housing portion to the rear of the main housing portion along the angled side wall demarcation portion.

7. An information handling system comprising:
   a processor;
   a data bus coupled to the processor; and
   an information handling system chassis housing, the housing comprising
   a base chassis, the base chassis housing the processor, the base chassis comprising
      a top cover portion;
      a bottom cover portion; and,
      an internal air intake ducting system, the internal air intake ducting system comprising a fan and a thermal channeling component thermally coupled to the fan, the thermal channeling component extending from an interior of a side of the bottom cover portion to the fan, the thermal channeling component and the bottom cover portion defining an air channel between the side of the bottom cover portion and the fan, the thermal channeling component being affixed to an internal surface of the side of the bottom cover portion; and wherein
      providing the air channel between the side of the bottom cover portion and the fan provides a thermal venting solution that does not rely on one or both of bottom venting and thermal feet.

8. The information handling system of claim 7, wherein:
   the thermal channeling component is thermally coupled to the fan via a gasket.

9. The information handling system of claim 7, wherein:
   the thermal channeling component is thermally coupled to the fan via a fan thermal channeling component mounting portion.

10. The information handling system of claim 7, wherein:
    the thermal channeling component comprises a step portion, the step portion providing a taller air channel along a portion of the air channel between the side of the bottom cover and the fan.

11. The information handling system of claim 10, wherein:
    the taller air channel is proximate with the fan.

12. The information handling system of claim 7, wherein:
    the bottom cover comprises an angled side wall demarcation portion, the angled side wall demarcation portion extending downwardly from a front of the main housing portion to a rear of the main housing portion; and, an air intake is integrated into the angled side wall demarcation portion, the air intake extending downwardly from the front of the main housing portion to the rear of the main housing portion along the angled side wall demarcation portion.

* * * * *